US010847660B2

(12) United States Patent
Quddus et al.

(10) Patent No.: US 10,847,660 B2
(45) Date of Patent: Nov. 24, 2020

(54) TRENCH SEMICONDUCTOR DEVICE HAVING MULTIPLE ACTIVE TRENCH DEPTHS AND METHOD

(71) Applicant: SEMICONDUCTOR COMPONENTS INDUSTRIES, LLC, Phoenix, AZ (US)

(72) Inventors: Mohammed Tanvir Quddus, Chandler, AZ (US); Mihir Mudholkar, Tempe, AZ (US); Michael Thomason, Blackfoot, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/546,049

(22) Filed: Aug. 20, 2019

(65) Prior Publication Data

US 2019/0386153 A1 Dec. 19, 2019

Related U.S. Application Data

(62) Division of application No. 14/640,242, filed on Mar. 6, 2015, now Pat. No. 10,431,699.

(51) Int. Cl.
*H01L 29/872* (2006.01)
*H01L 29/66* (2006.01)
(Continued)

(52) U.S. Cl.
CPC .......... *H01L 29/8725* (2013.01); *H01L 29/36* (2013.01); *H01L 29/66143* (2013.01);
(Continued)

(58) Field of Classification Search
CPC ............. H01L 29/8725; H01L 29/7811; H01L 29/407; H01L 29/66143; H01L 29/872; H01L 29/063; H01L 29/0634
See application file for complete search history.

(56) References Cited

U.S. PATENT DOCUMENTS 5,111,253 A 5/1992 Korman et al.
5,262,669 A 11/1993 Wakatabe et al.
(Continued)

*Primary Examiner* — Monica D Harrison
*Assistant Examiner* — John Lin
(74) *Attorney, Agent, or Firm* — Kevin B. Jackson

(57) ABSTRACT

A method of forming a semiconductor device includes providing a region of semiconductor material comprising a major surface. A termination trench is provided extending from a first portion of the major surface into the region of semiconductor material to a first depth and has a first width. A first active trench is provided extending from a second portion of the major surface into the region of semiconductor material to a second depth and has a second width less than the first width. A second active trench is provided extending from a third portion of the major surface into the region of semiconductor material to a third depth and has a third width less than the first width. A first conductive material is provided adjoining a fourth portion of the major surface, which is configured as a Schottky barrier. The selected trench depth difference alone or in combination with other features provides a semiconductor device having improved performance characteristics.

19 Claims, 9 Drawing Sheets

(51) Int. Cl.
  *H01L 29/36* (2006.01)
  *H01L 29/16* (2006.01)
  *H01L 29/20* (2006.01)
  *H01L 29/205* (2006.01)

(52) U.S. Cl.
  CPC ...... *H01L 29/1608* (2013.01); *H01L 29/2003* (2013.01); *H01L 29/205* (2013.01)

(56) References Cited

U.S. PATENT DOCUMENTS

| | | |
|---|---|---|
| 5,365,102 A | 11/1994 | Mehrotra et al. |
| 5,612,567 A | 3/1997 | Baliga |
| 5,679,966 A | 10/1997 | Baliga et al. |
| 5,859,465 A | 1/1999 | Spring et al. |
| 5,949,124 A | 9/1999 | Hadizad et al. |
| 5,998,833 A | 12/1999 | Baliga |
| 6,078,090 A | 6/2000 | Williams et al. |
| 6,309,929 B1 | 10/2001 | Hsu et al. |
| 6,441,454 B2 | 8/2002 | Hijzen et al. |
| 6,498,367 B1 | 12/2002 | Chang et al. |
| 6,515,330 B1 | 2/2003 | Hurtz et al. |
| 6,537,921 B2 | 3/2003 | Metzler |
| 6,656,843 B2 | 12/2003 | Bol |
| 6,855,593 B2 | 2/2005 | Andoh et al. |
| 6,977,208 B2 | 12/2005 | Chiola |
| 6,979,874 B2 | 12/2005 | Harada |
| 7,034,376 B2 | 4/2006 | Okada et al. |
| 7,045,397 B1 | 5/2006 | Yu et al. |
| 8,766,279 B1 | 7/2014 | Yen et al. |
| 2005/0062124 A1 | 3/2005 | Chiola |
| 2005/0161758 A1 | 7/2005 | Chiola |
| 2007/0145429 A1 | 6/2007 | Francis et al. |
| 2009/0057756 A1* | 3/2009 | Hshieh .............. H01L 29/7811 257/330 |
| 2011/0227152 A1 | 9/2011 | Hsu |

* cited by examiner

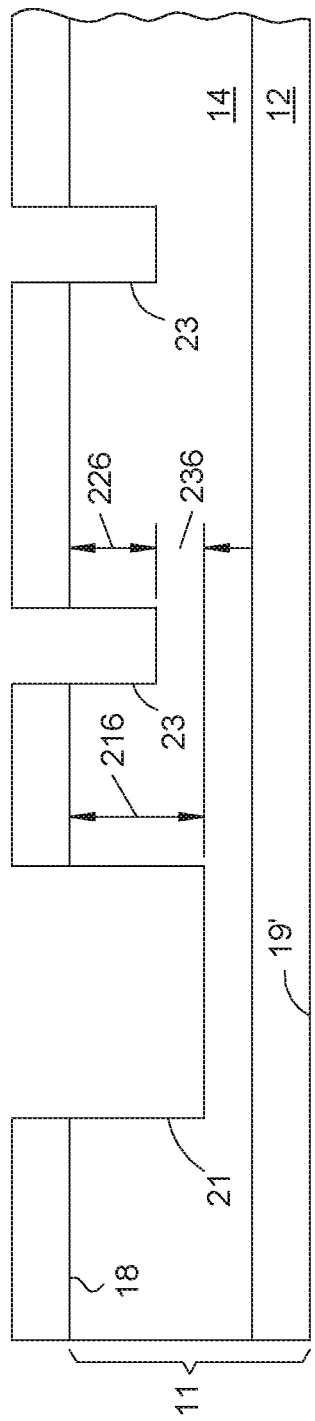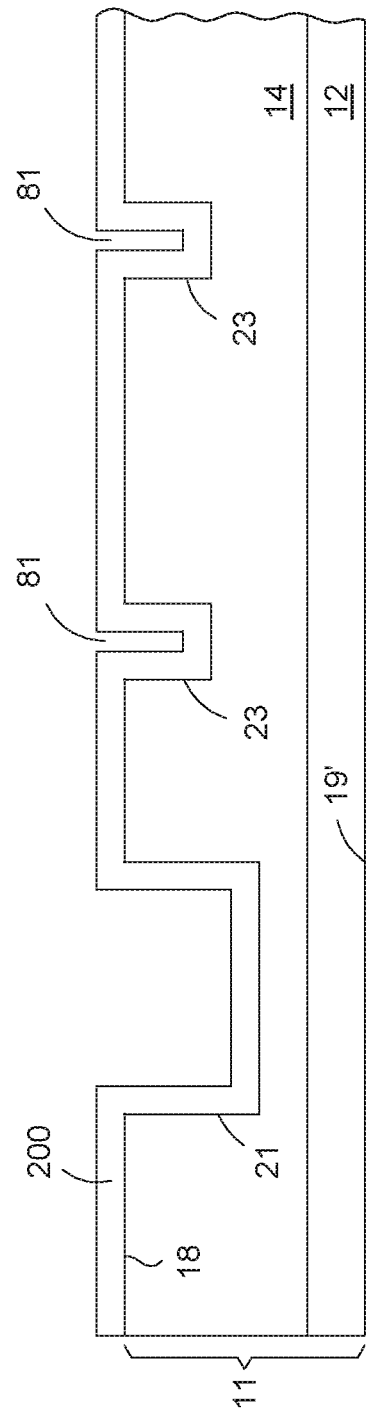

TRENCH SEMICONDUCTOR DEVICE HAVING MULTIPLE ACTIVE TRENCH DEPTHS AND METHOD

CROSS-REFERENCE TO RELATED APPLICATIONS

This application is a divisional application of U.S. application Ser. No. 14/640,242 filed on Mar. 6, 2015 and issued as U.S. Pat. No. 10,431,699 on Oct. 1, 2019, which is hereby incorporated by reference.

BACKGROUND

The present invention relates, in general, to electronics and, more particularly, to semiconductor device structures and methods of forming semiconductor devices.

A Schottky device is a type of semiconductor device that exhibits a low forward voltage drop and a very fast switching action. The lower forward voltage drop translates into less energy wasted as heat, which provides improved system efficiency and higher switching speed compared to conventional PN junction diodes. This makes Schottky devices more suitable for applications requiring higher efficiency power management. Such applications include wireless/portable devices, boost converters for LCD/keypad backlighting, charge circuits as well as other small signal applications.

With demands to further improve battery life in these applications and others, the market is requiring even higher efficiency devices, such as Schottky devices having lower power dissipation, higher power density, and smaller die size. However, related Schottky device designs have not provided a viable solution to meet the higher efficiency requirement. The related devices have exhibited poor performance including, among other things, higher than expected leakage current and higher than expected forward voltage drop. In addition, this poor performance has made it difficult to produce a device capable of meeting present and emerging industry requirements for unclamped inductive switching (UIS), electro-static discharge (ESD), and/or surge non-repetitive forward current (IFSM) performance.

Accordingly, it is desired to have a method for forming a higher efficiency Schottky device and a structure that exhibits, among other things, an improved tradeoff between a lower leakage and a lower forward voltage drop to provide lower power dissipation and higher power density in a reduced die size. Additionally, it is also beneficial for the method and structure to be cost effective and easy to integrate into preexisting process flows.

BRIEF DESCRIPTION OF THE DRAWINGS

FIGS. 2-14 illustrate partial cross-sectional views of the embodiment of FIG. 1 at various successive stages of fabrication in accordance with an embodiment of the present invention;

Figure 1:
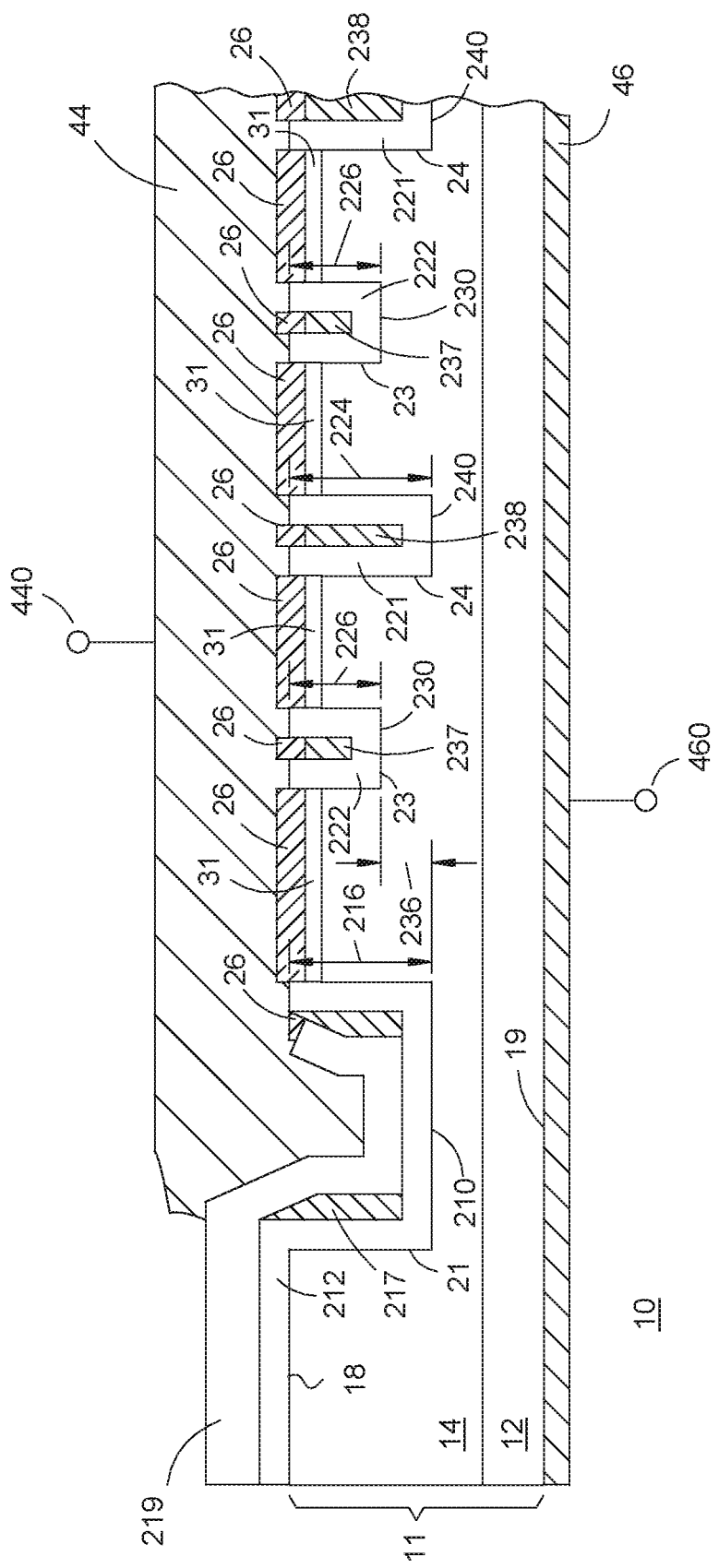
FIG. 1 illustrates a partial cross-sectional view of an embodiment of a semiconductor device in accordance with the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

In Schottky rectifiers that use trench structures and trench-MOS action, the trenches occupy an area in the active area or cell of the device. The area that they occupy is not used for conduction and instead is considered to be wasted active area space. Thus, it is desirable to minimize the size or width of the trenches in the active area to be as small as feasible while at the same time maintaining desired breakdown voltage characteristics and maintaining the integrity of dielectric material provided within the active trenches.

In general, the present embodiments relate to a semiconductor device and method of forming the semiconductor device having termination and active trenches in a Schottky rectifier configuration. A first active trench has a depth that is different than a second active trench. The first active trench also has a depth that is different than the termination trench. In one embodiment, the second active trench and the termination trench have approximately the same depth. This configuration enables trench Schottky devices having thinner epitaxial layers and higher dopant concentrations for selected breakdown voltages. The configuration provides, among other things, a device having reduced forward voltage drop and reduced current leakage. In one embodiment, the first active trench can be among a plurality of first active trenches interspersed among a plurality of second active trenches.

In an embodiment of the method, a first removal step, such as an etch step, is used to form both the first active trenches and termination trenches, and a second removal step is used to form the second active trenches. The method provides different trench depths for active trenches and the termination trenches. In accordance with the present embodiments, any decrease in breakdown voltage drop is minimized through a combination of active region dopant concentration and thickness, and active trench depth differences, width and pitch.

FIG. 1 illustrates an enlarged partial cross-sectional view of an electronic device 10, a semiconductor device 10, Schottky diode device 10, or trench Schottky rectifier 10 in accordance with one embodiment. In the present embodiment, device 10 includes a region of semiconductor material 11, which includes a major surface 18 and an opposing major surface 19. Region of semiconductor material 11 can include a bulk substrate 12, such as an n-type silicon substrate having a resistivity ranging from about 0.001 ohm-cm to about 0.005 ohm-cm. By way of example, substrate 12 can be doped with phosphorous, arsenic, or antimony.

Device 10 further includes a semiconductor layer 14, doped region 14, or doped layer 14, which can be formed in, on, or overlying substrate 12. In one embodiment, semiconductor layer 14 can be an n-type conductivity region or layer, and can be formed using epitaxial growth techniques, ion implantation and diffusion techniques, or other techniques known to those of ordinary skill in the art. In one embodiment, semiconductor layer 14 includes major surface 18 of region of semiconductor material 11. In some embodiments, semiconductor layer 14 has a dopant concentration less than the dopant concentration of substrate 12. As will be described in more detail later, the dopant concentration and/or dopant profile of semiconductor layer 14 is selected in combination with other features of the present embodiment to provide a desired breakdown voltage and a reduced forward voltage drop compared to related devices. It is understood that region of semiconductor material 11, semiconductor substrate 12, and/or semiconductor layer 14 can include other types of materials including, but not limited to, heterojunction semiconductor materials, and semiconductor substrate 12 and semiconductor layer 14 can each include different materials. Such materials can include SiGe, SiGeC, SiC, GaN, AlGaN, and other similar materials as known to those of ordinary skill in the art.

In accordance with the present embodiment, device 10 includes a first trench 21 or termination trench 21 and second trenches 23 or active trenches 23. In one embodiment, termination trench 21 extends from major surface 18 into semiconductor layer 14 towards semiconductor substrate 12. In some embodiments, termination trench 21 can extend into semiconductor substrate 12. In other embodiments, termination trench 21 can terminate within semiconductor layer 14 thereby leaving a portion of semiconductor layer 14 disposed between a lower extent of termination trench 21 and semiconductor substrate 12. In one embodiment, termination trench 21 includes a dielectric layer 212, a dielectric region 212, or a dielectric structure 212 disposed adjoining sidewall and lower surfaces of termination trench 21 as generally illustrated in FIG. 1.

In accordance with the present embodiment, dielectric layer 212 defines a lower surface 210 of termination trench 21 at a depth 216 from major surface 18. It is understood that lower surface 210 may not be flat, but may have other shapes including, but not limited to curved, rounded, partially-curved, or partially-rounded shapes. In accordance with one embodiment, depth 216 corresponds to the lowest extent of lower surface 210 from major surface 18. In one embodiment, dielectric layer 212 can be a thermal oxide having a thickness in a range from approximately 0.05 microns to approximately 0.5 microns. In other embodiments, dielectric layer 212 can be other types of oxides, nitrides, combinations thereof, or other materials known to those of ordinary skill in the art.

In one embodiment, termination trench 21 further includes one or more conductive spacers 217 along sidewall surfaces adjoining dielectric layer 212. In one embodiment, conductive spacers 217 can be a conductive polycrystalline material, such as a doped polysilicon. In one embodiment, a dielectric layer 219, a dielectric region 219, or a dielectric structure 219 is disposed within termination trench 21. In one embodiment, dielectric layer 219 can be further disposed on or adjacent a portion of major surface 18 spaced away from active trenches 23 as generally illustrated in FIG. 1. In one embodiment, dielectric layer 219 can be a deposited dielectric material, such as a deposited oxide, a deposited nitride, combinations thereof, or other dielectric materials as known to those of ordinary skill in the art. In accordance with the present embodiment, dielectric layer 219 can be an oxide deposited using a tetra-ethyl-orthosilicate ("TEOS") source using plasma-enhanced chemical vapor deposition ("PECVD") or low pressure chemical vapor deposition ("LPCVD"), and can have a thickness in a range from approximately 0.2 microns to approximately 1.0 micron. In some embodiments, termination trench 21 can have a width in a range from approximately 4 microns to approximately 20 microns. In one embodiment, termination trench 21 can have a width of approximately 10 microns.

In accordance with the present embodiment, device 10 includes active trenches 23 and active trenches 24 extending from major surface 18 into semiconductor layer 14 towards semiconductor substrate 12. In one embodiment, active trenches 23 include a dielectric layer 222, a dielectric layer 222, a dielectric region 222, or a dielectric structure 222 disposed adjoining sidewall and lower surfaces of active trenches 23. In one embodiment, active trenches 24 include a dielectric layer 221, a dielectric region 221, or a dielectric structure 221 disposed adjoining sidewall and lower surfaces of active trenches 24. In accordance with the present embodiment, dielectric layer 222 defines a lower surface 230 of active trenches 23 at a depth 226 from major surface 18 and dielectric layer 221 defines a lower surface 240 of active trenches 24 at a depth 224 from major surface 18. It is understood that lower surfaces 230 and 240 may not be flat, but can have other shapes including, but not limited to curved, rounded, partially-curved, or partially-rounded shapes. In accordance with one embodiment, depth 226 corresponds to the lowest extent of lower surface 230 from major surface 18, and depth 224 corresponds to the lowest extent of lower surface 240 from major surface 18. In accordance with the present embodiment, depths 226 and 224 are different from each other and depth 226 is different than depth 216 of termination trench 21. In one embodiment, depths 224 and 216 are substantially the same depth. In one embodiment, dielectric layers 221 and 222 comprise a thermal oxide having a thickness in a range from approximately 0.05 microns to approximately 0.6 microns. In some embodiments, dielectric layer 212 and dielectric layers 221 and 222 can be the same material. In some embodiments, dielectric layer 212 and dielectric layer 221 can be formed during the same process step. In accordance with the present embodiment, dielectric layer 222 can be a different material than dielectric layer 221 and/or can have a different thickness than dielectric layer 221, which adds to design flexibility.

In one embodiment, active trenches 23 and 24 further include a conductive layer 237/238, a conductive region 237/238 or a conductive material 237/238 provided along surfaces adjoining dielectric layer 222/221 respectively. In one embodiment, conductive material 237/238 can be a conductive polycrystalline material, such as a doped polysilicon. In some embodiments, active trenches 23 and 24 can have a width in a range from approximately 0.1 microns to approximately 0.6 microns. In one embodiment, active trenches 23 and 24 can have a width of approximately 0.3 microns. In accordance with the present embodiment, device 10 can have an active trench 23 width to termination trench 21 width ratio less in a range from approximately 0.005 to approximately 0.125. In other embodiments, device 10 can have an active trench 23 width to termination trench 21 width ratio less than approximately 0.03.

In accordance with the present embodiment, depth 216 of termination trench 21 and depth 224 of active trenches 24 are greater than depth 226 of active trenches 23 so that a trench depth difference 236 (that is, depth 216 minus depth 226 and/or depth 224 minus depth 226) greater than zero exists between termination trench 21 and active trenches 23 and between active trenches 24 and active trenches 23.

Device 10 further includes conductive layer 26, conductive region or regions 26, or conductive material 26 disposed adjoining portions of major surface 18. In some embodiments, conductive material 26 also can be disposed adjoining upper surface portions of conductive material 237/238 and upper surface portions of conductive spacers 217. In accordance with the present embodiment, conductive material 26 comprises a material configured to provide a Schottky barrier with region of semiconductor material 11 or semiconductor layer 14. Such materials can include platinum, nickel-platinum (with various platinum atomic weight percentages, for example, from approximately 1% to approximately 80%, with 5% being selected in some embodiments), titanium, titanium-tungsten, chromium, and/or other materials capable of forming a Schottky barrier as known to those of ordinary skill in the art.

In other embodiments, device 10 may also include a doped region 31, which can be either n-type or p-type provided adjacent major surface 18 and adjacent conductive material 26. In one embodiment, doped region 31 can be configured to adjust the barrier height between region of semiconductor material 11 and conductive material 26 in accordance with desired device characteristics. Doped region 31 can be provided using ion implantation and anneal techniques, epitaxial growth techniques, or other doping techniques as known to those of ordinary skill in the art. In one embodiment, doped region 31 extends into region of semiconductor material 11 less than approximately 1.0 micron. In other embodiments, doped region 31 can be provided in only some mesa regions and not in others to provide different Schottky barrier heights between mesa regions.

In some embodiments, device 10 may include a deeper doped region (not illustrated) provided below doped region 31 to provide for conduction tuning of the device. This may also be done by providing, for example, a graded dopant profile within semiconductor layer 14 by using graded epitaxial growth techniques or by using multiple ion implants.

A conductive layer 44 can be formed overlying major surface 18, and a conductive layer 46 can be formed overlying major surface 19. Conductive layers 44 and 46 can be configured to provide electrical connection between device 10 and a next level of assembly. In accordance with the present embodiment, conductive layer 44 is electrically connected to conductive material 26. In one embodiment, conductive layer 44 can be titanium/titanium-nitride/aluminum-copper or other related or equivalent materials known by one of ordinary skill in the art and is configured as first current carrying electrode or terminal 440 or an anode electrode 440 for device 10. In one embodiment, conductive layer 46 can be a solderable metal structure such as titanium-nickel-silver, chromium-nickel-gold, or other related or equivalent materials known by one of ordinary skill in the art. In the embodiment illustrated, conductive layer 46 provides a second current carrying electrode or terminal 460 or a cathode electrode 460 for device 10.

In accordance with the present embodiment, active trenches 23 and 24 are configured to have a reduced width compared to related devices in order to reduce the area occupied by the trenches in the active area. This reduced width increases their aspect ratio (that is, depth to width ratio), which results in termination trench 21 being formed to a greater depth than active trenches 23 during their single formation step to provide trench depth difference 236. In accordance with the present embodiment as will be described in more detail hereinafter, active trenches 24 can be formed in a separate masking and etching step so that active trenches 24 can have substantially the same depth as termination trench 21.

Evaluation studies were done on device 10 with active trenches 23 and 24 to evaluate breakdown voltage VR (volts), leakage current IR (Amps) and forward voltage drop VF (volts) compared to a standard planar Schottky device and a trench Schottky rectifier where all of active trenches were shallower than termination trench 21. The same device package and die size were used for the evaluation. For device 10, the resistivity of semiconductor layer 14 was 0.12 ohm-cm, the trench depth difference 236 was 1.2 microns between active trenches 23 and termination trench 21, and the depths of termination trench 21 and active trenches 24 were substantially the same. In one of the trench Schottky rectifier devices, the trench depth difference between all of the active trenches and the termination trench was 1.2 microns and the resistivity of semiconductor layer proximate to the Schottky barrier was 0.18 ohm-cm (Device A). For the other trench Schottky rectifier device, the trench depth difference between all of the active trenches and the termination trench was 1.2 microns, and the resistivity of semiconductor layer proximate to the Schottky barrier was 0.12 ohm-cm (Device B). For the planar Schottky rectifier, the resistivity of the semiconductor layer proximate to the Schottky barrier was 0.7 ohm-cm (Planar Device).

The evaluation studies showed that the device 10 had a breakdown voltage of 53.7 volts, Device A had a breakdown voltage of 52 volts, Device B had a breakdown voltage of 49.2 volts, and the Planar Device had a breakdown voltage of 50 volts. Also, device 10 had a forward voltage at 0.5 Amps of 0.47 volts, Device A had a forward voltage at 0.5 Amps of 0.6 volts, Device B had a forward voltage at 0.5 Amps of 0.46 volts, and the Planar Device had a forward voltage at 0.5 Amps of 0.78 volts. Additionally, device 10 had a forward voltage at 1.0 Amp of 0.66 volts, Device A had a forward voltage at 1.0 Amp of 0.76 volts, Device B had a forward voltage at 1.0 Amp of 0.65 volts, and the Planar Device had an unmeasurable forward voltage at 1.0 Amp. In addition, device 10 had a leakage current IR at 40 volts of 1.1 micro-Amps, Device A had a leakage current IR at 40 volts of 0.18 micro-Amps, Device B had a leakage current IR at 40 volts of 2.9 micro-Amps, and the Planar Device had a leakage current IR at 40 volts of 7.0 micro-Amps. Finally, device 10 and Device B showed the best power dissipation of about 16 milli-Watts, Device A had a power dissipation of about 21 milli-Watts, and the Planar Device had a power dissipation of about 27.5 milli-watts. Based on the foregoing data device 10 exhibited the best overall performance. This data is further summarized in Table 1.

TABLE 1

Summary Data

| Device | VR | VF @ 0.5 Amps | VF @ 1 Amp | IR @ 40 Volts | Power Dissipation |
|---|---|---|---|---|---|
| Device 10 | 53.7 Volts | 0.47 Volts | 0.66 Volts | 1.1 micro-Amps | 16 milli-Watts |
| Device A | 52 Volts | 0.6 Volts | 0.76 Volts | 0.18 micro-Amps | 21 milli-Watts |
| Device B | 49.2 Volts | 0.46 Volts | 0.65 Volts | 2.9 micro-Amps | 16 milli-Watts |
| Planar Device | 50 Volts | 0.78 Volts | N/A | 7.0 micro-Amps | 27.5 milli-Watts |

In another evaluation study, data for two configurations of a trench Schottky rectifier without active trenches 24 and having a trench depth difference 236 of 1.2 microns and data for two configurations of a device where the trench depth difference 236 is zero were studied. In one configuration of both devices, the dopant concentration of semiconductor layer 14 was $4.0 \times 10^{16}$ atoms/cm$^3$ and in the other configuration of both devices, the dopant concentration of semiconductor layer was $1.0 \times 10^{16}$ atoms/cm$^3$. In all devices, the thickness of semiconductor layer 14 was 3.5 microns. In related trench Schottky rectifiers, a dopant concentration of $1.0 \times 10^{16}$ atoms/cm$^3$ is a typical dopant concentration for a 45 volt device and $4.0 \times 10^{16}$ atoms/cm$^3$ is a typical dopant concentration for a 40 volt device.

The additional evaluation showed that breakdown voltage decreased as trench depth difference 236 changed from zero to 1.2 microns. This is believed to be the result of deeper termination trench 21, which may reduce the supported electric field along lower surface 210 as well as reduction of the electric field along the sidewall surfaces of termination trench 21. However, it was unexpected to see that although breakdown voltage decreased by approximately 12 volts for the 45 volt material (that is, dopant concentration of $1.0 \times 10^{16}$ atoms/cm$^3$) from 62 volts to 50 volts, VR decreased by only approximately 4 volts for the 40 volt material (that is, dopant concentration of $4.0 \times 10^{16}$ atoms/cm$^3$) from 56 volts to approximately 52 volts.

Based on this unexpected result, the variation in breakdown voltage VR with trench depth difference 236 using different dopant concentrations for semiconductor layer 14 of 3.5 microns in thickness was also studied. This study showed that breakdown voltage VR variation with trench depth difference 236 decreases with decreasing dopant concentration of semiconductor layer 14. At higher dopant concentrations (for example, approximately $6.0 \times 10^{16}$ atoms/cm$^3$), the breakdown voltage unexpectedly remains substantially unchanged with changes in the trench depth difference 236. It is believed that this results from, at least in part, a reduced surface field ("RESURF") effect provided by the configuration of device 10 in accordance with the present embodiment. Also, a charge sharing effect along sidewall surfaces of termination trench 21 is believed to contribute to sustaining the breakdown voltage. In one embodiment, the surfaces of the termination trench adjoining semiconductor layer 14 are configured (e.g., shape, dielectric thickness, conductive spacers 217, and/or dopant concentration of semiconductor layer 14) to provide a field shaping and/or charge sharing effect for the semiconductor device. In accordance with the present embodiment, increasing the dopant concentration of semiconductor layer 14 reduces the effect of trench depth difference 236 on breakdown voltage VR, which also improves overall performance and robustness of device 10.

Further in accordance with the present embodiment, it is believed that, among other things, adding alternate deeper active trenches 24 with device 10 provides for a more uniform electric field spreading over the entire device structure. In addition, the deeper active trenches 24 provide secondary electric field pinching off between them, which reduce electric field near the Schottky surface further than a structure where the active trenches are all shallower. As discussed previously, the configuration of device 10 enables the use of a lower resistivity semiconductor layer 14 (0.12 ohm-cm), while providing a breakdown voltage VR of 53.7 V. This is a gain of 4 V in breakdown voltage over a structure where the active trenches are all shallower (about an 8% gain in VR).

In summary, the present embodiment provides several benefits compared to other trench Schottky rectifiers and planar Schottky rectifiers including a higher breakdown voltage VR and lower forward voltage VF with only a slightly higher IR. The structure of device 10 enables higher dopant concentrations to be used within semiconductor layer 14, which provides, among other things, lower forward voltages and thus, lower power dissipation. This also helps improve other device characteristics, such as UIS and ESD.

In one embodiment, active trenches 23 have a depth 226 in a range from approximately 0.5 microns to approximately 10.0 microns without dielectric layer 222, and active trenches 24 have a depth 224 in a range from approximately 1.0 micron to approximately 10.0 microns without dielectric layer 222. In one embodiment, termination trench 21 has a depth 216 in a range from approximately 1.7 microns to approximately 6.0 microns without dielectric layer 212. In some embodiments, semiconductor layer 14 has a thickness in a range from approximately 1 micron to approximately 15 microns and dopant concentration in a range from approximately $5.0 \times 10^{13}$ atoms/cm$^3$ to approximately $5.0 \times 10^{17}$ atoms/cm$^3$. In some embodiments, trench depth difference 236 is in a range greater than zero to approximately 3.0 microns.

In one embodiment, trench depth difference 236 is less than approximately 2.0 microns. In another embodiment, trench depth difference 236 is in a range greater than zero to approximately 1.0 microns. In a further embodiment, trench depth difference 236 is in a range greater than zero to approximately 0.8 microns. In a still further embodiment for a 20 volt trench semiconductor device, semiconductor layer 14 has a thickness from approximately 2.0 microns to approximately 2.5 microns, a dopant concentration in a range from approximately $2.0 \times 10^{16}$ atoms/cm$^3$ and approximately $8.0 \times 10^{16}$ atoms/cm$^3$, and a trench depth difference 236 in a range greater than zero to approximately 2.0 microns. In another embodiment for a 30 volt trench semiconductor device, semiconductor layer 14 has a thickness from approximately 2.4 microns to approximately 3.2 microns, a dopant concentration in a range from approximately $1.5 \times 10^{16}$ atoms/cm$^3$ and approximately $7.0 \times 10^{16}$ atoms/cm$^3$, and a trench depth difference 236 in a range from greater than zero to approximately 1.8 microns. In a further embodiment, for a 40 volt trench semiconductor device, semiconductor layer 14 has a thickness from approximately 3.0 microns to approximately 4.0 microns, a dopant concentration in a range from approximately 1.0× 10$^{16}$ atoms/cm$^3$ and approximately 6.0×10$^{16}$ atoms/cm$^3$, and a trench depth difference 236 in a range greater than zero to approximately 1.5 microns.

In another embodiment, the active trenches 23 and 24 have a pitch in a range from approximately 0.5 microns to about 4.5 microns. It is understood that depending on the desired layout, this includes the pitch between an active trench 23 adjacent an active trench 24, an active trench 23 adjacent another active trench 23, and/or an active trench 24 adjacent another active trench 24. It is further understood that in some embodiments, the pitch between adjacent active trenches 23 can be different than the pitch between active trenches 24. In a further embodiment, the pitch can be in a range from approximately 0.6 microns to approximately 0.75 microns. In still further embodiment, the pitch can be in a range from approximately 0.85 microns to about 0.95 microns. In another embodiment, the pitch can be in a range from approximately 1.1 microns to approximately 1.25 microns. In a further embodiment, the spacing between adjacent active trenches 23 and 24 can be in a range from approximately 0.4 microns to approximately 4.0 microns.

Figure 2:
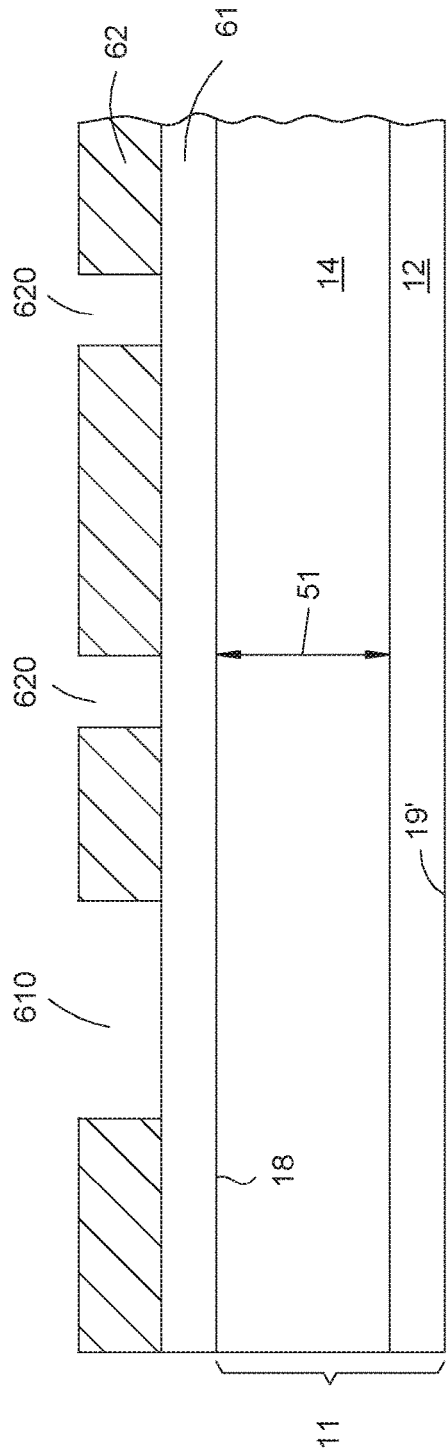

Turning now to FIGS. 2-14, a method for forming device 10 in accordance with one embodiment is described. In FIG. 2, which is a partial cross-section view of device 10 at an early step in fabrication, region of semiconductor material 11 is provided having substrate 12 with major surface 19' and semiconductor layer 14 with major surface 18. In one embodiment, substrate 12 can be an n-type silicon substrate having a resistivity ranging from about 0.001 ohm-cm to about 0.005 ohm-cm and can be doped with arsenic. In one embodiment, semiconductor layer 14 is provided using epitaxial growth techniques and can be provided having a thickness 51 in a range from approximately 1.0 microns to approximately 15 microns. In one embodiment, semiconductor layer 14 can have dopant concentration in one of the ranges described previously. In one embodiment semiconductor layer 14 is n-type and doped with phosphorous. In some embodiments, semiconductor layer 14 has a substantially uniform dopant profile along or over thickness 51. In other embodiments, semiconductor layer 14 has a non-uniform dopant profile along or over thickness 51. For example, semiconductor layer 14 can have a graded dopant profile where the dopant concentration can decrease from major surface 18 over thickness 51 towards substrate 12. In another example, the dopant concentration can increase over thickness 51 from major surface 18 towards substrate 12. In yet another example, the dopant concentration can first increase and then decrease over thickness 51 from major surface 18 towards substrate 12. In one embodiment, a layer 61 can be formed on major surface 18. In one embodiment, layer 61 can be a dielectric material, such as an oxide or another material configured for providing a hard mask. In one embodiment, layer 61 is a thermal oxide having a thickness in a range from about 0.1 microns to about 0.5 microns. A masking layer 62 is then formed on layer 61. In one embodiment, masking layer 62 can be a photoresist layer patterned to provide an opening 610 configured in a desired pattern for termination trench 21, and to provide openings 620 configured in a desired pattern for active trenches 23.

Figure 3:
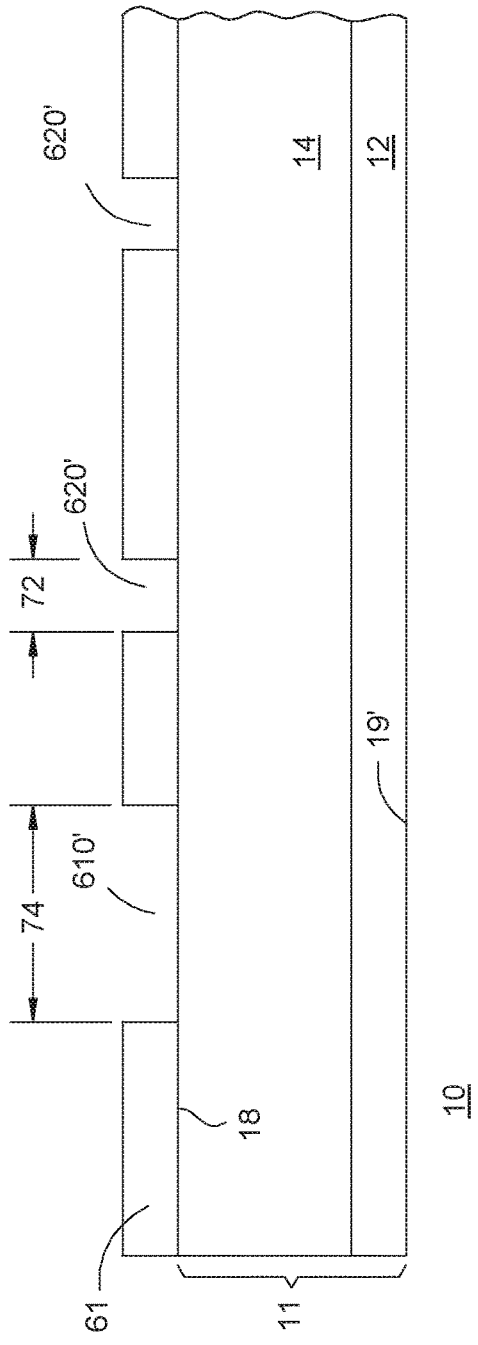

FIG. 3 illustrates a partial cross-sectional view of device 10 after additional processing. A removal step, such as an etch step, can be used to provide openings 610' and 620' in layer 61. Masking layer 62 can then be removed. The foregoing steps can provide opening 610' having a width 74 in a range from approximately 4 microns to approximately 20 microns, and can provide openings 620' having a width 72 of approximately 0.1 microns to approximately 0.5 microns. In one embodiment, width 72 is approximately 0.3 microns.

FIG. 4 illustrates a partial cross-sectional view of device 10 after additional processing. In accordance with the present embodiment, a single removal step is used to form both termination trench 21 and active trenches 23, which have different depths. In one embodiment, termination trench 21 and active trenches 23 can be etched using plasma etching techniques with a fluorocarbon chemistry or a fluorinated chemistry (for example, SF$_6$/O$_2$) or other chemistries or removal techniques as known to those of ordinary skill in the art. In one embodiment, active trenches 23 have a depth 226 in a range from approximately 0.5 microns to approximately 4.0 microns. In one embodiment, termination trench 21 has a depth 216 in a range from approximately 1.0 micron to approximately 10.0 microns. In accordance with the present embodiment, active trenches 23 are provided with a depth 226 and termination trench is provided with a depth 216 greater than depth 226. This difference provides trench depth difference 236.

FIG. 5 illustrates a partial cross-sectional view of device 10 after further processing. In one embodiment, a layer 200 is formed along surfaces of termination trench 21, surfaces of active trenches 23, and major surface 18. In one embodiment, layer 200 is a dielectric material, such as an oxide, a nitride, tantalum pentoxide, titanium dioxide, barium strontium titanate, high k dielectric materials, combinations thereof, or other related or equivalent materials known by one of ordinary skill in the art. In one embodiment, layer 200 is a thermal oxide having a thickness in a range from approximately 0.05 microns to approximately 0.6 microns. In accordance with the present embodiment, layer 200 has a selected thickness that leaves a gap 81 or void 81 between adjacent surfaces of layer 200 within active trenches 23 as generally illustrated in FIG. 5. In other embodiments, the sidewall surfaces of termination trench 21 can be sloped to provide further field shaping effects.

Figure 6:
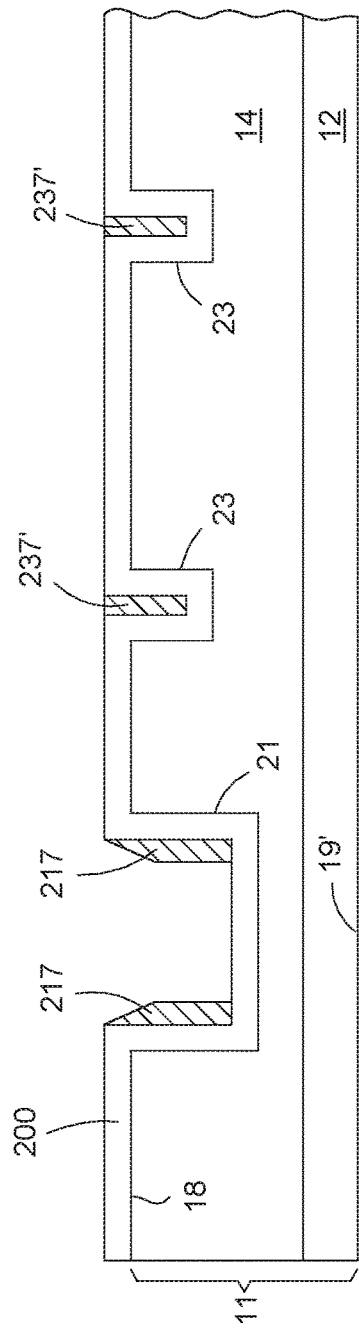

In subsequent steps, a conductive layer is provided on layer 200 and then partially removed or etched back to provide conductive spacers 217 within termination trench 21 and conductive layers 237' within active trenches 23 as illustrated in FIG. 6. In one embodiment, the conductive layer can be a polysilicon layer doped with an n-type dopant, such as phosphorous. In one embodiment, the dopant concentration can be approximately 2.0×10$^{19}$ atoms/cm$^3$. In one embodiment, conductive spacers 217 are provided having a thickness of approximately 1.6 microns.

Figure 7:
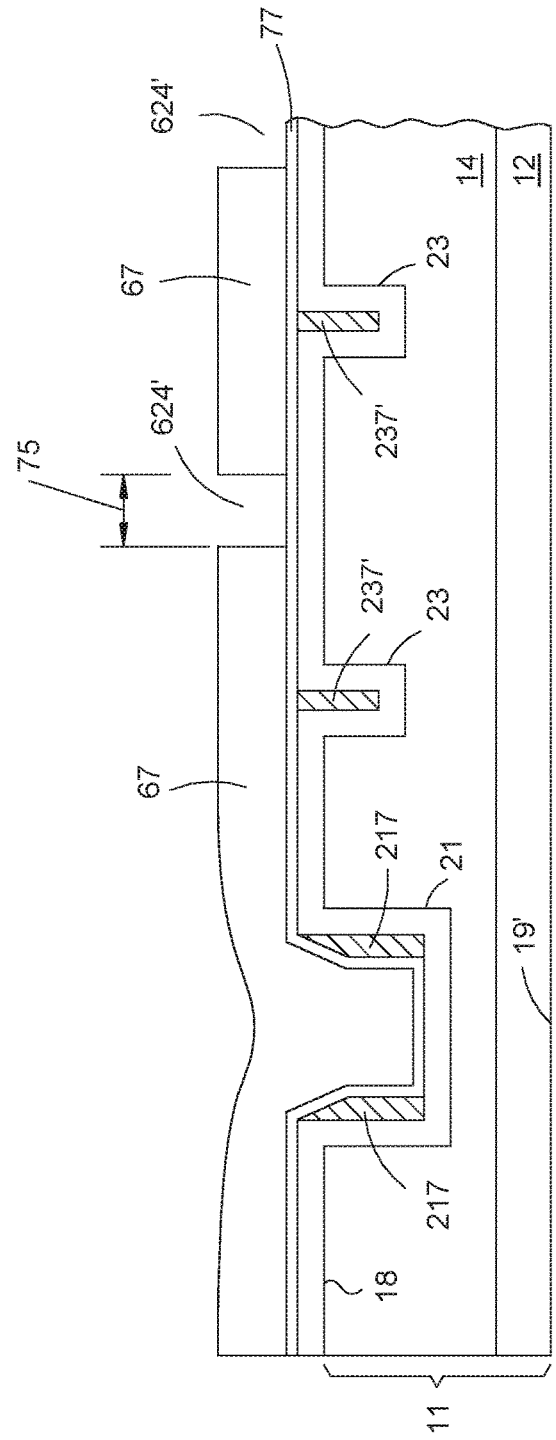

FIG. 7 illustrates a partial cross-sectional view of device 10 after additional processing. In one embodiment, a layer 77 of material is provided adjacent layer 200 and spacers 217. In one embodiment, layer 77 is a dielectric material, such a silicon nitride or another oxidation resistant material. In one embodiment, layer 77 has a thickness from approximately 0.15 microns to approximately 0.3 microns. Next, a masking layer 67 is provided on layer 77 and patterned to provide openings 624' for active trenches 24. In one embodiment, masking layer 67 can be a photoresist layer. In one embodiment, openings 624' having a width 75 of approximately 0.1 microns to approximately 0.6 microns. In one embodiment, width 75 is approximately 0.3 microns.

Figure 8:
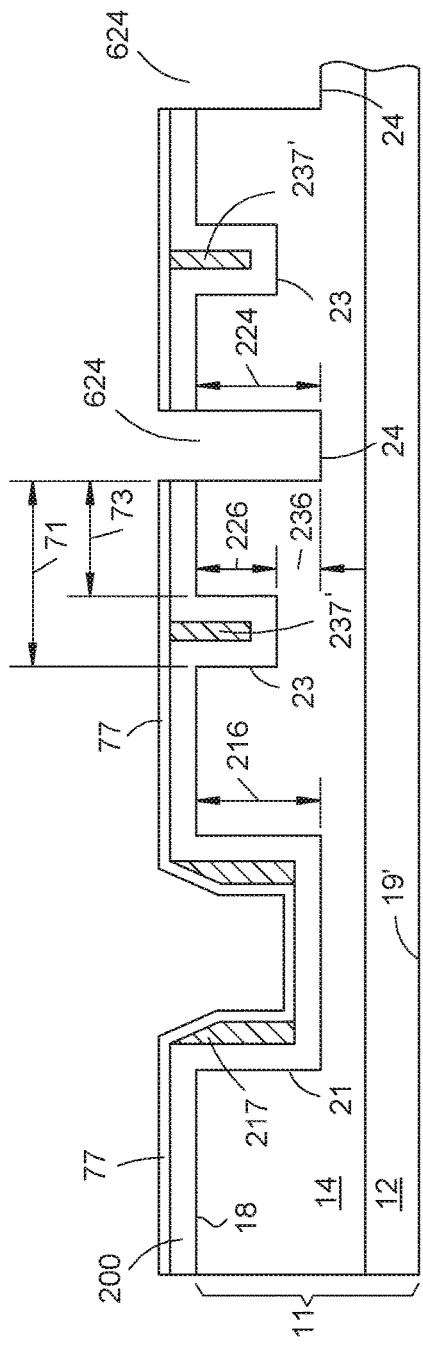
Figure 9:
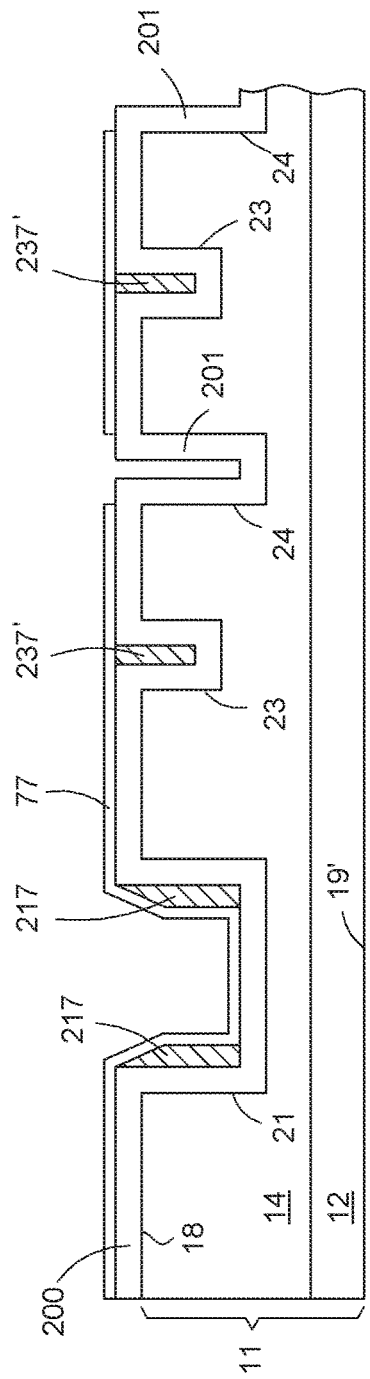

FIG. 8 illustrates a partial cross-sectional view of device 10 after still further processing. In one embodiment, one or more removal steps are used to remove portions of layer 77 and layer 200 adjacent openings 624' to provide openings 624. Masking layer 67 can then be removed. Next, active trenches 24 can be etched using plasma etching techniques with a fluorocarbon chemistry or a fluorinated chemistry (for example, $SF_6/O_2$) or other chemistries or removal techniques as known to those of ordinary skill in the art. In one embodiment, active trenches 24 have a depth 224 in a range from approximately 1.0 microns to approximately 10.0 microns. In one embodiment, active trenches 23 are provided with a depth 226 and active trenches 24 are provided with a depth 224 greater than depth 226. In one embodiment, this difference can be substantially equal to trench depth difference 236. In one embodiment, device 10 can have a spacing 73 in a range from approximately 0.4 microns to approximately 3.5 microns, and a pitch 71 in a range from approximately 0.5 microns to about 4.5 microns. In one embodiment, active trenches 24 have a width 75. In accordance with the present embodiment, width 75 can be the same or different to width 72 of active trenches 23, which adds to design flexibility. Next, a layer 201 of material can be provided within active trenches 24 as illustrated in FIG. 9. In one embodiment, layer 201 can be the same or a similar material to layer 200. In one embodiment, layer 201 has a thickness in a range from approximately 0.05 microns to approximately 0.2 microns. In some embodiments, layer 201 has a similar thickness to layer 200. In other embodiments, layer 201 can be thicker or thinner than layer 200, which adds to design flexibility. In subsequent step, layer 77 can be removed.

Figure 10:
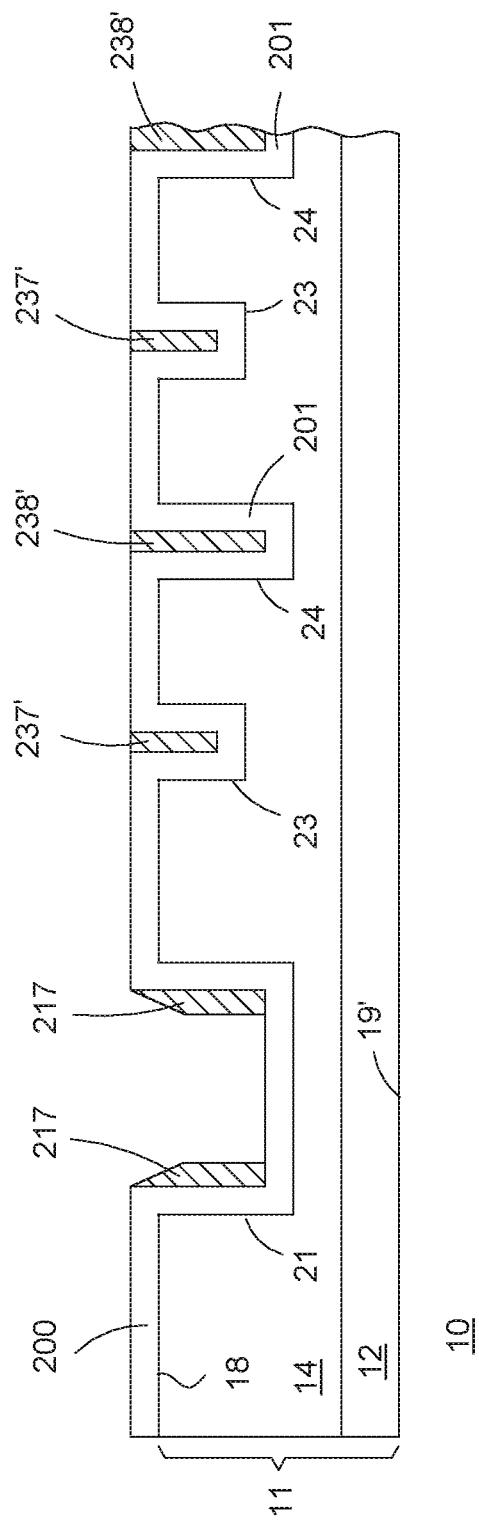

In subsequent steps, another conductive layer is provided on layer 201 and then partially removed or etched back to provide conductive layers 238' within active trenches 24 as illustrated in FIG. 10. In one embodiment, the conductive layer can be a polysilicon layer doped with an n-type dopant, such as phosphorous. In one embodiment, the dopant concentration can be approximately $2.0 \times 10^{19}$ atoms/cm$^3$.

Figure 11:
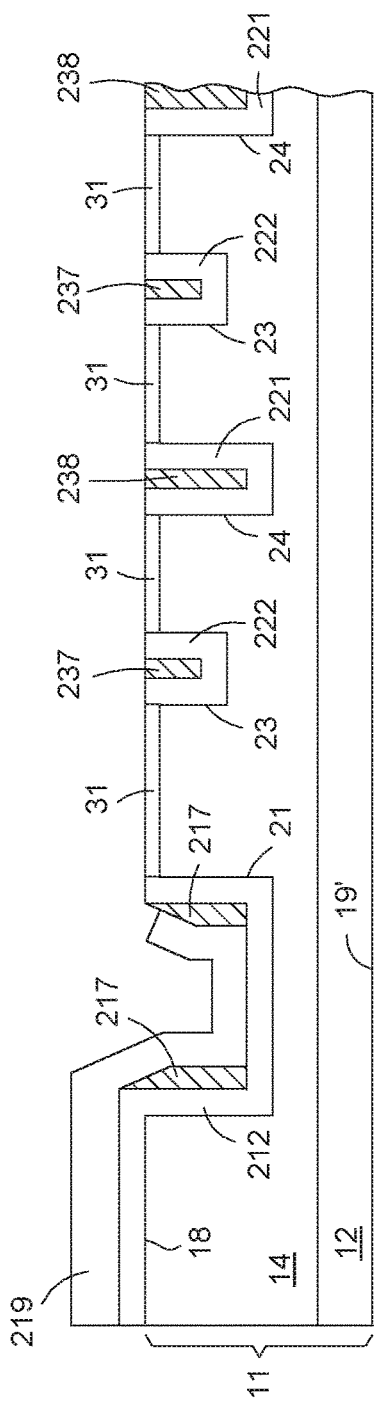

FIG. 11 illustrates a partial cross-sectional view of device 10 after further processing. In one embodiment, a layer of material is provided adjacent major surface 18. In accordance with the present embodiment, the layer of material can be a TEOS oxide deposited using a PECVD process or an LPCVD process, and can have thickness in a range from approximately 0.35 microns to approximately 0.7 microns. Next, a masking step and removal step can be used to leave a portion of the layer of material within termination trench 21 to provide dielectric layer 219. The masking and removal steps can further remove portions of layer 200 from the active region of device 10 to expose portions of major surface 18. This provides dielectric layer 212 within termination trench 21, dielectric layers 222 within active trenches 23, and dielectric layers 221 within active trenches 24. The masking and removal steps can also remove portions of conductive layers 237' to provide conductive layers 237 and portions of conductive layers 238' to provide conductive layers 238. In an optional step, doped region 31 can be provided at this stage of fabrication, and can be formed using ion implantation or other doping techniques as known to those of ordinary skill in the art. Also additional n-type dopant can be added to semiconductor layer 14 between active trenches 23 to provide semiconductor layer 14 with a modified dopant profile, such as a non-uniform dopant profile. This can provide for conduction adjustment in accordance with desired performance requirements.

Figure 12:
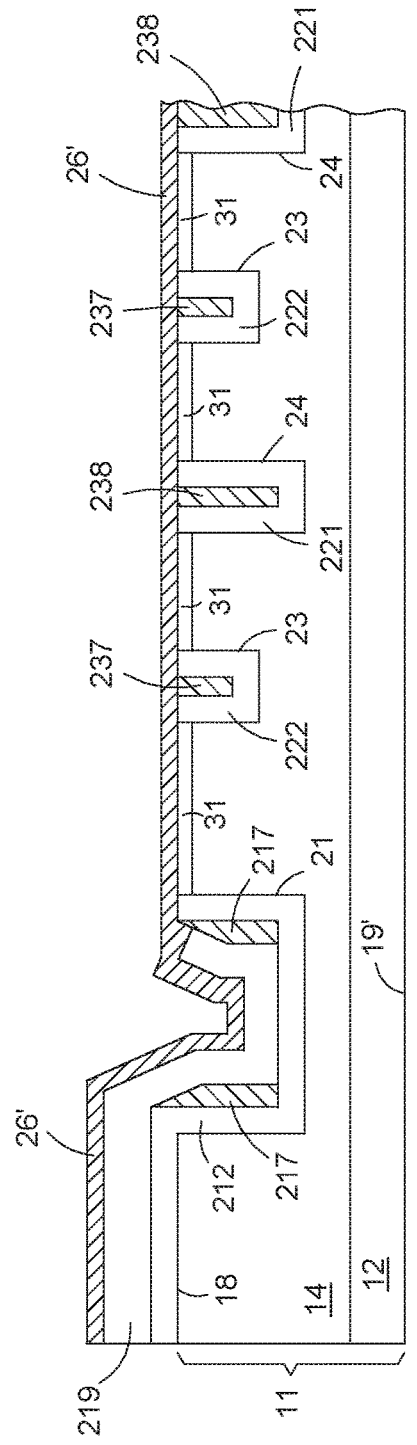
Figure 13:
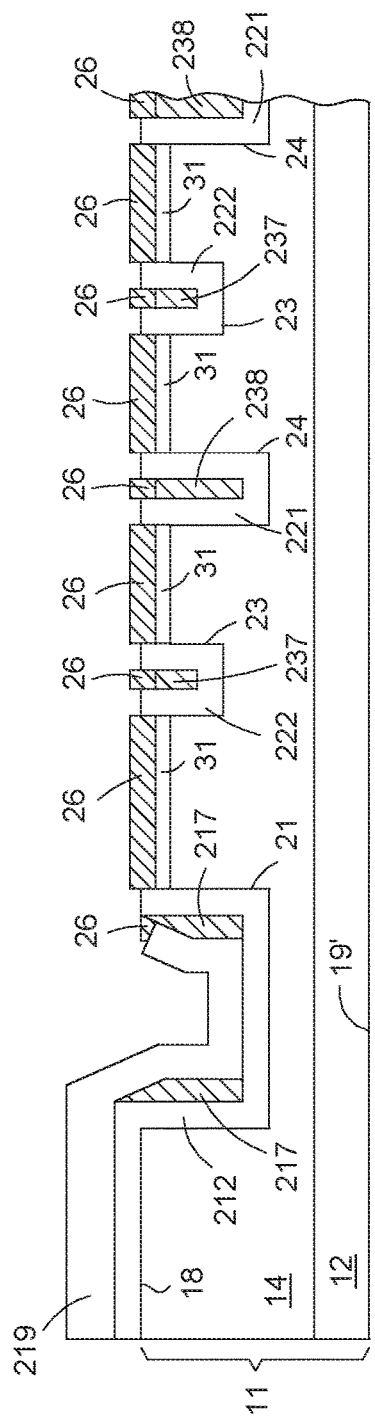

FIG. 12 illustrates a partial cross-sectional view of device 10 after still further processing. In one embodiment, the exposed portions of major surface 18 are cleaned using, for example, a hydrofluoric acid process. Next, conductive layer 26' is provided on device 10 proximate to major surface 18. In accordance with the present embodiment, conductive layer 26' comprises a material configured to provide a Schottky barrier with semiconductor layer 14. Such materials can include platinum, nickel-platinum, titanium, titanium-tungsten, chromium, and/or other materials capable of forming a Schottky barrier as known to those of ordinary skill in the art. In some embodiments, conductive layer 26' can be heat treated or annealed to provide silicide regions and then portions of conductive layer 26' are removed to provide conductive material 26 as illustrated in FIG. 13. In accordance with the present embodiment, a portion of conductive material 26 is provided on conductive spacer 217 as generally illustrated in FIG. 13. This provides for improved electrical contact between conductive spacer 217 and conductive layer 44.

Figure 14:
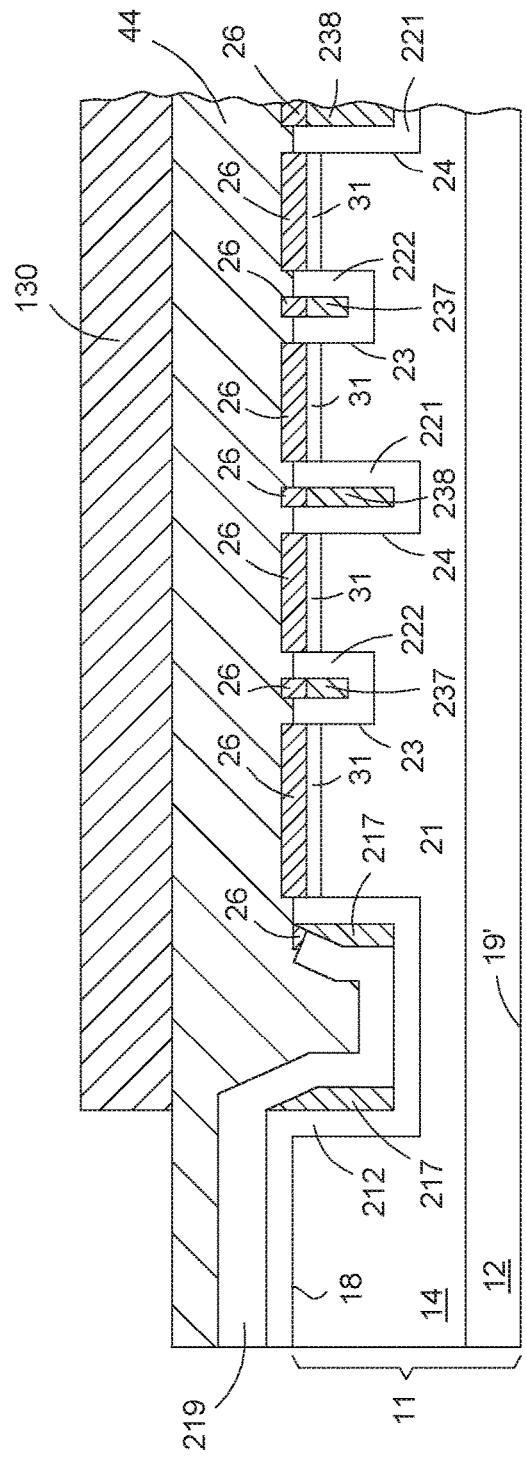

FIG. 14 illustrates a partial cross-sectional view of device 10 after additional processing. In one embodiment, a conductive layer is provided on device 10 proximate to major surface and then patterned using a masking layer 130. This provides conductive layer 44. In one embodiment, conductive layer 44 can be titanium/titanium-nitride/aluminum-copper or other related or equivalent materials known by one of ordinary skill in the art and is configured as first current carrying electrode or terminal 440 or an anode electrode 440 for device 10. Next, substrate 12 can be thinned to decrease its thickness using, for example, a grinding process to provide major surface 19. Conductive layer 46 can then be provided on major surface 19 as described and illustrated in FIG. 1.

In a further embodiment, the method described in FIGS. 2-14 can be used to manufacture a semiconductor device having high aspect ratio active trenches or active trench widths less than approximately 0.5 microns for some embodiments or less than approximately 0.3 microns for other embodiments, where it is desired that all of the active trenches have approximately the same trench depths as the termination trench. Stated another way, for a trench Schottky rectifier device having termination trench 21 as illustrated in FIG. 1 and only active trenches 24 (that is, active trenches 23 replaced with active trenches 24), the method would use one masking step as illustrated in FIGS. 2-3 to form opening 610' and subsequently termination trench 21, and use another masking step as illustrated in FIGS. 7-9 to form openings 624' and subsequently all active trenches 24 having depths similar to the depth of termination trench 21. This method could be used, for example, to provide a trench Schottky device embodiment with high aspect ratio active trenches 24 having trench depth 224 similar to trench depth 216 of termination trench 21 without active trenches 23.

Figure 15:
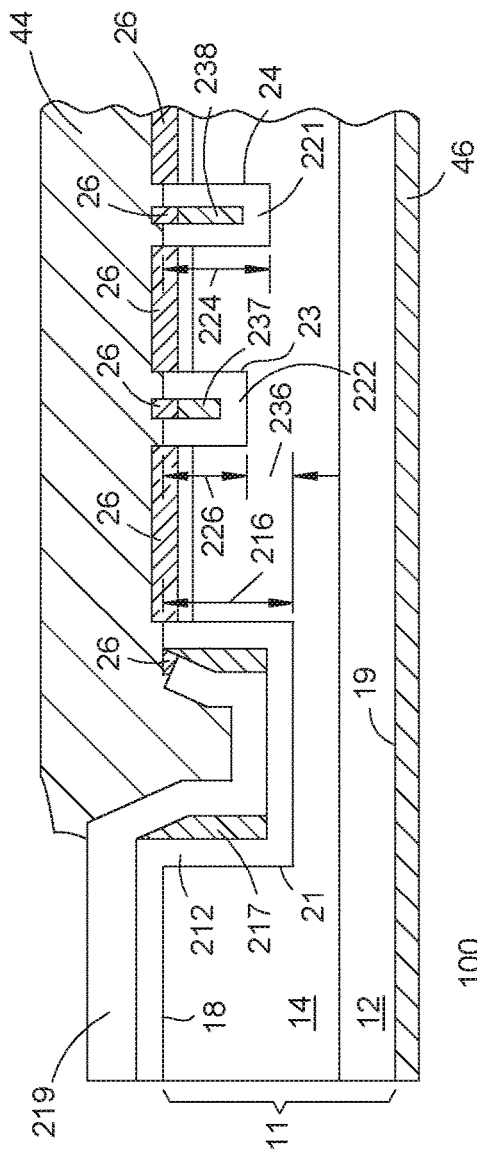
FIG. 15 illustrates a partial cross-sectional view of another embodiment of a semiconductor device in accordance with the present invention.

FIG. 15 illustrates a partial cross-sectional view of an electronic device 100, a semiconductor device 100, Schottky diode device 100, or trench Schottky rectifier 100 in accordance with another embodiment. Device 100 is similar to device 10 and only the differences between the two devices are described hereinafter. Specifically, in device 100 depth 216 of trench 21, depth 226 of active trenches 23, and depth 224 of active trenches are each different from each other. In one embodiment, depth 216 is greater than depths 226 and 224, and depth 224 is greater than depth 226. In one embodiment, the width of active trenches 24 is greater than the width of the active trenches 23. In another embodiment, the width of active trenches 24 can be smaller than the width of active trenches 23.

Figure 16:
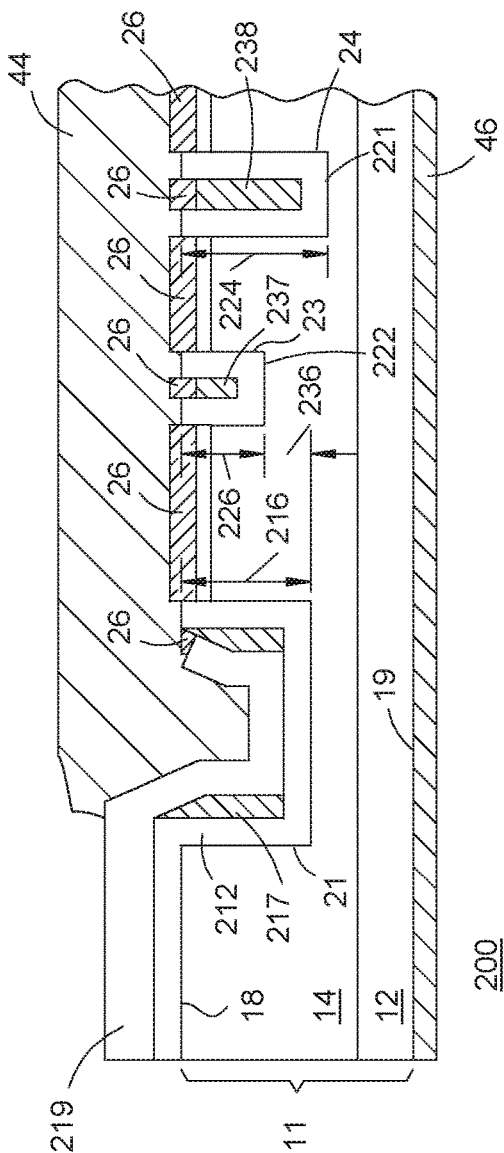
FIG. 16 illustrates a partial cross-sectional view of a further embodiment of a semiconductor device in accordance with the present invention.

FIG. 16 illustrates a partial cross-sectional view of an electronic device 200, a semiconductor device 200, Schottky diode device 200, or trench Schottky rectifier 200 in accordance with another embodiment. Device 200 is similar to devices 10 and 100 and only the differences between the three devices are described hereinafter. Specifically, in device 200 depth 216 of trench 21, depth 226 of active trenches 23, and depth 224 of active trenches are each different from each other. In one embodiment, depth 216 is greater than depth 226, and depth 224 is greater than depths 216 and 226.

In some embodiments, devices 10, 100, and 200 can have at least one active trench 24 disposed between a pair of active trenches 23. In other embodiments, a pair of active trenches 24 can be disposed between a pair of active trenches 23. In still further embodiments, at least two active trenches 23 separate each active trench 24. One of ordinary skill in the art will appreciate that other combinations active trenches 23 and active trenches 24 are possible as well. Additionally, in some embodiments, the width of active trenches 24 is greater than the width of the active trenches 23 (for example, as illustrated in FIG. 16). In other embodiments, the width of active trenches 24 can be smaller than the width of active trenches 23 (for example, as illustrated in FIG. 15).

From all of the foregoing, one skilled in the art can determine that, according to one embodiment, a semiconductor device (for example, elements 10, 100, 200) includes a region of semiconductor material (for example, elements 11, 12, 14) having a first conductivity type and a major surface (for example, element 18). A first active trench (for example, element 23) extends from a first portion of the major surface into the region of semiconductor material to a first depth (for example, element 226), wherein the first active trench has a first width (for example, element 72). A second active trench extends from a second portion of the major surface into the region of semiconductor material to a second depth (for example, 224), wherein the second active trench has a second width (for example, element 75), and wherein the second depth is greater than the first depth. A first conductive material (for example, element 237) is within the first active trench and separated from the region of semiconductor material by a first dielectric region (for example, element 222). A second conductive material (for example, element 238) within the second active trench and separated from the region of semiconductor material by a second dielectric region (for example, element 221). A third conductive material (for example, element 26) adjoins a third portion of the major surface, wherein the third conductive material is configured to provide a Schottky barrier.

From all of the foregoing, one skilled in the art can determine that, according to another embodiment, the semiconductor device can further include a third trench (for example, element 21) extending from a fourth portion of the major surface into the region of semiconductor material, wherein at least a portion of third trench can extend to a third depth (for example, element 216), the third trench can have a third width (for example, element 74), the third depth can be greater than the first depth (for example, element 236), and the third width can be greater than the first width and the second width. In a further embodiment, the third depth and the second depth can be substantially equal. In a still further embodiment, the second depth can be greater than the third depth. In another embodiment, the third depth can be greater than the first depth in a range greater than zero to approximately 3.0 microns. In a further embodiment, the third depth can be greater than the first depth in a range greater than zero to approximately 2.0 microns. In a still further embodiment, the third depth can be greater than the first depth in a range greater than zero to approximately 1.5 microns. In another embodiment, the second width can be different than the first width. In a further embodiment, the semiconductor device can have a first width to third width ratio in a range from approximately 0.005 to approximately 0.125. In a still further embodiment, the semiconductor device can have a first width to third width ratio is less than or equal to approximately 0.03. In another embodiment, the first dielectric region and the second dielectric region have different thicknesses.

From all of the foregoing, one skilled in the art can determine that, according to another embodiment, the region of semiconductor material comprises a semiconductor layer (for example, element 14) adjoining a semiconductor substrate (for example, element 12); the semiconductor layer defines the major surface; and the semiconductor layer has a first dopant concentration and the semiconductor substrate has a second dopant concentration greater than the first dopant concentration. In a further embodiment, the third depth is greater than the first depth in a range greater than zero to approximately 3.0 microns. In a still further embodiment, the semiconductor layer has a thickness from approximately 1.0 micron to approximately 15 microns. In another embodiment, the first dopant concentration is in a range from approximately $5.0 \times 10^{13}$ atoms/cm$^3$ and approximately $5.0 \times 10^{17}$ atoms/cm$^3$. In a further embodiment, the semiconductor layer can have a thickness from approximately 1.0 microns to approximately 2.5 microns; the first dopant concentration can be in a range from approximately $2.0 \times 10^{16}$ atoms/cm$^3$ and approximately $8.0 \times 10^{16}$ atoms/cm$^3$; and the third depth can be greater than the first depth in a range greater than zero to approximately 2.0 microns. In a still further embodiment, the semiconductor layer can have a thickness from approximately 2.4 microns to approximately 3.2 microns; the first dopant concentration is in a range from approximately $1.5 \times 10^{16}$ atoms/cm$^3$ and approximately $7.0 \times 10^{16}$ atoms/cm$^3$; and the third depth can be greater than the first depth in a range greater than zero to approximately 1.8 microns. In another embodiment, the semiconductor layer can have a thickness from approximately 3.0 microns to approximately 6.0 microns; the first dopant concentration can be in a range from approximately $1.0 \times 10^{16}$ atoms/cm$^3$ and approximately $6.0 \times 10^{16}$ atoms/cm$^3$; and the first depth can be greater than the second depth in a range greater than zero to approximately 1.5 microns.

From all of the foregoing, one skilled in the art can determine that, according to another embodiment, surfaces of the termination trench adjoining the semiconductor layer are configured to provide a field shaping effect for the semiconductor device. In a further embodiment, the semiconductor layer can have a non-uniform dopant profile. In still further embodiment, the first dielectric region has a thickness in a range from approximately 0.05 microns to approximately 0.6 microns. In a further embodiment, a doped layer (for example, element 31) adjoins the third portion of the major surface adjacent to the second conductive material. In a still further embodiment, the first width and the second width can be approximately the same.

From all of the foregoing, one skilled in the art can determine that, according to a further embodiment, a semiconductor device (for example, elements 10, 100, 200) includes a region of semiconductor material (for example, element 11) comprising a semiconductor layer (for example, element 14) adjoining a semiconductor substrate (for example, element 12), the semiconductor layer defining a major surface (for example, element 18), wherein the semiconductor layer has a first dopant concentration and the semiconductor substrate has a second dopant concentration greater than the first dopant concentration. A first trench (for example, element 21) extends from a first portion of the major surface into the region of semiconductor material, wherein the first trench extends to a first depth (for example, element 216), and wherein the first trench has a first width (for example, element 74). A second trench (for example, element 23) extends from a second portion of the major surface into the region of semiconductor material to a second depth (for example, element 226), wherein the second trench has a second width (for example, element 72) less than the first width, and wherein the first depth is greater than the second depth to define a trench depth difference (for example, element 236). A third trench (for example, element 24) extends from a third portion of the major surface into the region of semiconductor material to a third depth (for example, element 224) greater than the second depth, wherein the third trench has a third width (for example, element 75). A first conductive material (for example, element 237) is within the second trench and separated from the region of semiconductor material by a first dielectric region (for example, element 222). A second conductive material (for example, element 26) adjoins a fourth portion of the major surface, wherein the second conductive material is configured to provide a Schottky barrier.

From all of the foregoing, one skilled in the art can determine that according to another embodiment, the trench depth difference can be greater than zero but less than approximately 3.0 microns. In a further embodiment, the semiconductor layer can have a thickness from approximately 1.0 micron to approximately 15 microns. In a still further embodiment, the first dopant concentration can be in a range from approximately $5.0 \times 10^{13}$ atoms/cm$^3$ and approximately $5.0 \times 10^{17}$ atoms/cm$^3$. In another embodiment, the first trench can be configured as a termination trench. In a further embodiment, the second trench and the third trench can be configured as active trenches. In a still further embodiment, the second width and the third width are different. In another embodiment, the first depth, the second depth, and the third depth are different from each other.

From all of the foregoing, one skilled in the art can determine that according to another embodiment, a method of forming Schottky semiconductor device (for example, elements 10, 100, 200) includes providing a region of semiconductor material (for example, element 11) comprising a semiconductor layer (for example, element 14) adjoining a semiconductor substrate (for example, element 12), the semiconductor layer defining a major surface (for example, element 18), wherein the semiconductor layer has a first dopant concentration and the semiconductor substrate has a second dopant concentration greater than the first dopant concentration. The method includes, providing a first trench (for example, element 21) extending from a first portion of the major surface into the region of semiconductor material, wherein the first trench extends to a first depth (for example, element 216), and wherein the first trench has a first width (for example, element 74). The method includes providing a first active trench (for example element 23) extending from a second portion of the major surface into the region of semiconductor material to a second depth (for example, element 226), wherein the first active trench has a second width (for example, element 72) less than the first width. The method includes providing a second active trench (for example, element 24) extending from a third portion of the major surface into the region of semiconductor material to a third depth (for example, element 224), wherein the second active trench has a third width (for example, element 75) less than the first width. The method includes providing a conductive material (for example, element 26) adjoining a fourth portion of the major surface, wherein the conductive material is configured to provide a Schottky barrier.

From all of the foregoing, one skilled in the art can determine that according to another embodiment, providing the second active trench includes providing the third depth greater than the second depth. In a further embodiment, providing the first trench and providing the first active trench comprises forming the first trench and the first active trench in a single removal step, wherein the first depth is greater than the second depth to provide a trench depth difference; and the trench depth difference is greater than zero and less than approximately 3.0 microns. In a still further embodiment, providing the first trench and providing the first active trench includes providing a first width to third width ratio less than or equal to approximately 0.03, and wherein the first depth, the second depth, and the third depth are different. In another embodiment, wherein providing the first trench and providing the first active trench includes providing a first width to third width ratio less than or equal to approximately 0.03, and wherein providing the first active trench and providing the second active trench comprises forming the first active trench and the second active trench in a single removal step, and wherein the first depth, the second depth, and the third depth are substantially equal. In a further embodiment, the method can further include providing a first dielectric structure in the first active trench; and providing a second dielectric structure in the second active trench. In still further embodiment, providing the second dielectric structure includes providing the second dielectric structure having a different thickness than that of the first dielectric structure.

In view of all of the above, it is evident that a novel structure and method of making the structure are disclosed. Included, among other features, is a trench Schottky rectifier device having a termination trench, first active trenches, and second active trenches. The termination trench and some of the first active trenches have different depths to provide a selected trench depth difference. The second active trenches are provided with substantially the same depth as the termination trench. The trench depth difference in combination with one or more of first active trench width to termination width ratio, layer dopant concentration, and/or dopant profile of the semiconductor layer, and layer thickness provide a structure having low leakage, low forward drop, fast switching and soft recovery. This provides a needed solution to industry demands for lower power dissipation, higher power density, improved ESD characteristics, improved UIS performance, and improved IFSM performance among others. Additionally, the method provides the trench depth difference in a single masking step, which provides a cost effective solution. Moreover, the deeper second active trenches provide a higher breakdown voltage compared to related devices. Finally, the method enables a trench Schottky rectifier having high aspect ratio active trenches that have the same depth as wider termination trench structures.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method of forming a semiconductor device, comprising:
    providing a region of semiconductor material comprising a major surface;
    providing a termination trench extending from a first portion of the major surface into the region of semiconductor material to a first depth, wherein the termination trench has a first width;
    providing a first active trench extending from a second portion of the major surface into the region of semiconductor material to a second depth, wherein the first active trench has a second width less than the first width;
    providing a second active trench extending from a third portion of the major surface into the region of semiconductor material to a third depth, wherein:
        the second active trench has a third width less than the first width,
        the third depth is greater than the second depth, and
        the first active trench is interposed between the termination trench and the second active trench in a cross-sectional view;
    providing a first conductive material adjoining a fourth portion of the major surface, wherein the first conductive material is configured to provide a Schottky barrier; and
    providing a second conductive material in the first active trench separated from the region of semiconductor material by a first dielectric structure; and
    providing a third conductive material in the second active trench separated from the region of semiconductor material by a second dielectric structure.

2. The method of claim 1, wherein:
    providing the termination trench and providing the first active trench comprises forming the termination trench and the first active trench in a single removal step, wherein:
        the first depth is greater than the second depth to provide a trench depth difference; and
        the trench depth difference is greater than zero and less than approximately 3.0 microns.

3. The method of claim 1, wherein:
    providing the termination trench and providing the first active trench includes providing a first width to third width ratio less than or equal to approximately 0.03.

4. The method of claim 1, wherein:
    providing the termination trench comprises forming the termination trench at an edge of the semiconductor device such that the termination trench is an outermost trench for the semiconductor device.

5. The method of claim 1, wherein:
    providing the second dielectric structure includes providing the second dielectric structure having a different thickness than that of the first dielectric structure.

6. A method of forming a semiconductor device comprising:
    providing a region of semiconductor material having a first conductivity type and a major surface;
    providing a termination trench extending from a first portion of the major surface into the region of semiconductor material to a first depth, the termination trench having a first width, wherein the termination trench is disposed at an edge of the semiconductor device such that the termination trench is an outermost trench for the semiconductor device;
    providing a first active trench extending from a second portion of the major surface into the region of semiconductor material to a second depth, wherein the first active trench has a second width;
    providing a second active trench extending from a third portion of the major surface into the region of semiconductor material to a third depth, wherein the second active trench has a third width, and wherein the third depth is greater than the second depth, wherein:
        the termination trench is laterally interposed between the edge and the first active trench and the second active trench;
        the first active trench is interposed between the second active trench and the termination trench;
        the first depth is greater than the second depth; and
        the first width is greater than the second width and the third width;
    providing a first conductive material within the first active trench and separated from the region of semiconductor material by a first dielectric region;
    providing a second conductive material within the second active trench and separated from the region of semiconductor material by a second dielectric region; and
    providing a third conductive material adjoining a fourth portion of the major surface, wherein the third conductive material is configured to provide a Schottky barrier.

7. The method of claim 6, wherein:
    providing the termination trench and providing the first active trench comprises providing the termination trench and the first active trench in a single removal step.

8. The method of claim 6, further comprising:
    providing a conductive spacer disposed along a sidewall of the termination trench and separated from the region of semiconductor material by a third dielectric region that adjoins the sidewall surface and a lower surface of the termination trench; and
    providing a dielectric layer disposed adjacent to the conductive spacer within the termination trench such that the conductive spacer is laterally interposed between the dielectric layer and the third dielectric region, wherein:
        the first depth is greater than the second depth in a range greater than zero to approximately 3.0 microns; and
        the third conductive material physically contacts the conductive spacer.

9. The method of claim 6, wherein:
    providing the first active trench comprises providing a plurality of first active trenches each having the second depth;

providing the second active trench comprises providing a plurality of second active trenches where at least two of the second active trenches have the third depth;

one of the plurality of first active trenches is interposed between an outermost one of the plurality of second active trenches and the termination trench in a cross-sectional view; and another one of the plurality of first active trenches is interposed between a pair of second active trenches in the cross-sectional view.

10. The method of claim 6, further comprising:

providing a third active trench extending from a fifth portion of the major surface to the second depth; and providing a fourth conductive material within the third active trench and separated from the region of semiconductor material by a third dielectric region; wherein:

the third width is different than the second width; and the second active trench is interposed between the first active trench and the third active trench in a cross-sectional view such that the second active trench is closer to the edge of the semiconductor device than the third active trench.

11. The method of claim 6, wherein:

providing the termination trench and providing the first active trench comprises providing a second width to first width ratio in a range from approximately 0.005 to approximately 0.125.

12. The method of claim 6, wherein:

providing the region of semiconductor material comprises providing a semiconductor substrate having a semiconductor layer adjoining a surface of the semiconductor substrate, wherein the semiconductor layer has a non-uniform dopant profile.

13. The method of claim 6 further comprising:

providing a doped layer adjoining the fourth portion of the major surface proximate to the third conductive material, wherein the doped layer has a fourth depth less than the second depth.

14. A method of forming a semiconductor device, comprising:

providing a region of semiconductor material comprising a semiconductor layer adjoining a semiconductor substrate, the semiconductor layer defining a major surface, wherein the semiconductor layer has a first dopant concentration and the semiconductor substrate has a second dopant concentration different than the first dopant concentration;

providing a termination trench extending from a first portion of the major surface into the region of semiconductor material, wherein:

the termination trench extends to a first depth;

the termination trench has a first width;

the termination trench is disposed at an edge portion of the semiconductor device such that the termination trench is an outermost trench for the semiconductor device;

providing first active trenches extending from second portions of the major surface into the region of semiconductor material to a second depth, wherein:

the first active trenches have a second width less than the first width; and the first depth is greater than the second depth to define a trench depth difference;

providing second active trenches extending from third portions of the major surface into the region of semiconductor material to a third depth greater than the second depth, wherein the second active trenches have a third width;

providing a first conductive material within the first active trenches and the second active trenches and each separated from the region of semiconductor material by a first dielectric region; and providing a second conductive material adjoining a fourth portion of the major surface, wherein the second conductive material is configured to provide a Schottky barrier, wherein:

the first active trenches and the second active trenches are provided in an alternating configuration such that at least one of the first active trenches is interposed between a pair of second active trenches in a cross-sectional view.

15. The method of claim 14, wherein:

providing the termination trench and providing the first active trenches comprises forming the termination trench and the first active trenches in a single removal step.

16. The method of claim 15, wherein providing the first active trenches comprises:

providing the trench depth difference greater than zero but less than approximately 3.0 microns; and providing another first active trench disposed as a closest active trench to the termination trench and further interposed between the termination trench and one of the second active trenches in the cross-sectional view.

17. The method of claim 15, wherein:

providing the termination trench and providing the first active trenches comprises providing a second width to first width ratio less than or equal to approximately 0.03.

18. The method of claim 15, wherein:

providing the first active trenches and providing the second active trenches comprises providing the second width different than the third width.

19. The method of claim 15, wherein:

the first depth, the second depth, and the third depth are each different depths.

\* \* \* \* \*